United States Patent
Culp et al.

(10) Patent No.: US 7,900,178 B2
(45) Date of Patent: Mar. 1, 2011

(54) INTEGRATED CIRCUIT (IC) DESIGN METHOD, SYSTEM AND PROGRAM PRODUCT

(75) Inventors: James A. Culp, Newburgh, NY (US); Gregory A. Northrop, Putnam Valley, NY (US); Ming Yin, Nanuet, NY (US)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 12/039,109

(22) Filed: Feb. 28, 2008

(65) Prior Publication Data

US 2009/0222783 A1     Sep. 3, 2009

(51) Int. Cl.
*G06F 17/50*     (2006.01)
(52) U.S. Cl. .......... 716/122; 716/106; 716/118; 716/119
(58) Field of Classification Search .................. 716/5, 8, 716/9, 10
See application file for complete search history.

(56) References Cited

U.S. PATENT DOCUMENTS

| | | | | |
|---|---|---|---|---|
| 5,519,628 | A * | 5/1996 | Russell et al. .................. | 716/10 |
| 5,787,274 | A * | 7/1998 | Agrawal et al. .................. | 1/1 |
| 5,987,237 | A * | 11/1999 | McBride .......................... | 703/1 |
| 6,892,373 | B2 | 5/2005 | Whitaker et al. | |
| 7,536,664 | B2 * | 5/2009 | Cohn et al. ....................... | 716/10 |
| 2006/0036977 | A1 | 2/2006 | Cohn et al. | |

OTHER PUBLICATIONS

International Search Report and Written Opinion of the International Searching Authority, dated Apr. 22, 2009.

* cited by examiner

*Primary Examiner* — Sun J Lin
(74) *Attorney, Agent, or Firm* — Law Office of Charles W. Peterson, Jr.; Steven Capella, Esq.

(57) ABSTRACT

A method of integrated circuit (IC) design, an IC design system and computer program product therefore, e.g., for L3GO designs. Special case cells are cells that represent specialized, process dependent components and are provided as dual representation cells with an internal view and external view. The external view is high level abstract representation that includes access pins, boundary and possible blocking shapes/layers and optionally, parameterizations. Each external view includes cell to cell spacing rules and connecting and blocking/keepout rules for placement and routing. The internal representation or, internal view includes regular shapes forming cell components and defining cell construction details and are ground rule clean by construction or verified by simulation or hardware.

35 Claims, 3 Drawing Sheets

INTEGRATED CIRCUIT (IC) DESIGN METHOD, SYSTEM AND PROGRAM PRODUCT

CROSS REFERENCE TO RELATED APPLICATION

The present invention is related to U.S. Pat. No. 7,536,664, entitled "PHYSICAL DESIGN SYSTEM AND METHOD" to Cohn et al., published as US 2006/0036977 A1, filed Aug. 12, 2004 and published Feb. 16, 2006, and to U.S. application Ser. No. 12/047,566, entitled "GRIDDED GLYPH GEOMETRIC OBJECTS (L3GO) DESIGN METHOD" to Lavin et al., filed coincident herewith, all assigned to the assignee of the present invention.

BACKGROUND OF THE INVENTION

1. Field of the Invention

The present invention is related to integrated circuit (IC) and chip design systems and more particularly to computer aided design (CAD) systems for designing ICs and IC chips.

2. Background Description

A typical integrated circuit (IC) chip includes a stack of several sequentially formed layers of shapes. Each layer is stacked or overlaid on a prior layer and patterned to form the shapes that define devices (e.g., field effect transistors (FETs)) and wires that connect the devices into circuits. Each of these layers of shapes, also known as mask levels or just "levels," may be created or printed optically through well known photolithographic masking, photo-developing and level definition techniques, e.g., etching, implanting, deposition and etc.

Normally, a chip designer creates an electrical and/or logic representation of a new circuit that is converted to a chip/circuit layout. The chip/circuit layout is converted to mask shapes that are printed on photolithographic masks. Depending upon the particular design, each of these layers may include several hundreds of millions or even billions of mask shapes. Each photolithographic mask is used to print a pattern on a semiconductor wafer, which may define local wafer properties or one of the chip/circuit layers. Mask errors translate to chip errors that can cause chip defects. Even the resulting defective chips are functional, the design may be marginal, reducing chip yield.

Consequently, as these masks become increasingly complex, generating complex masks has become more expensive, requiring increased design creativity and effort for lithographic patterning and for manipulating the design data flow to manufacturing. Thus, manufacturing costs and risks inherent in making these complex patterns have made ineffective and obsoleted some state of the art layout methodologies and computer-aided design tools that had otherwise been used.

One approach that has proven effective in simplifying and making these complex designs more manufacturable is in representing portions of a physical design in a compact format, now known as the gridded glyph geometric objects (L3GO) format. L3GO is described in U.S. Pat. No. 7,536,664, "Physical Design System And Method" to Cohn et al. Especially where design shapes are relatively regular, e.g., logic chips with mainly rectangular contacts, diffusions, gates and wring, Cohn et al. has proven effective in reducing the design and manufacturing costs and risks. However, Cohn et al. has not yet been applied, effectively, to circuits with features that may be process dependent and require special treatment, e.g., feature-specific design ground rules and checking. Such circuits that require special treatment may include, for example, Static Random Access Memory (SRAM) cells and decoupling capacitors, body contacts, diodes, polysilicon resistors, fuses, or bonding pads, e.g., Controlled Collapse Chip Connections (C4s).

Designers use an ad-hoc approach with state of the art SRAM cell design, for example. SRAM cells are designed for compactness (density) and signal balance. Typically, such an ad-hoc approach results in choosing irregular design shapes that are not easily represented in L3GO format. Likewise fuses require unique spacing to other features and a window above each fuse. This requires one or more additional mask steps or, a variation of one or more mask steps, to open the window. Checking these special cases requires checking that is unnecessary for the rest of the design. However, state of the art design rule checkers, for example, check the entire chip with compliance with each ground rule, including these feature-specific rules.

Consequently, insuring chip-wide compliance with these complicated feature-specific rules has reduced productivity. In addition to designer effort in designing to and verifying compliance with (checking) regular ground rules, for designers using special case cells (i.e., with these special case circuits), design and compliance is even more complicated and time consuming. Not only have these feature-specific rules complicated ground rule checker coding, for example, ground rule checker results have been complicated too and are difficult designers to understand. If one cannot understand the ground rule checker results, one cannot identify and fix violations. Moreover, these complicated rules have hampered design improvements from checking feedback, e.g., to adjust a design as process learning proceeds.

Thus, there is a need for design tools and methods that represent IC components that include specialized, process dependent features in an effective, useable and understandable format for designers; that facilitate faster IC checking (e.g., ground rules) than for the same IC otherwise checked with traditional tools, such as with the IC represented in a conventional format; that may be easily integrated into current design entry and flows, especially L3GO; and that facilitates IC design improvement after the design is complete.

SUMMARY OF THE INVENTION

It is a purpose of the invention to simplify circuit physical design;

It is yet another purpose of the invention to reduce the cost and risk of layout generation and layout checking of chips with circuits that include features that may be process dependent and require special treatment, e.g., feature-specific design ground rules and checking;

It is yet another purpose of the invention to improve the efficiency of layout data preparation in designs with circuits that include process dependent features that require feature-specific design ground rules and checking;

It is yet another purpose of the invention to improve the efficiency of ICs that include special case circuits that include features that may be process dependent and require special treatment, and are represented in gridded glyph geometric objects (L3GO) format.

The present invention relates to a method of integrated circuit (IC) design, an IC design system and computer program product therefore, e.g., for L3GO designs. Special case cells are cells that represent specialized, process dependent components and are provided as dual representation cells with an internal view and external view. The external view is high level abstract representation that includes access pins, boundary and possible blocking shapes/layers and optionally, parameterizations. Each external view includes cell to cell spacing rules and connecting and blocking/keepout rules for placement and routing. The internal representation or, internal view includes regular shapes forming cell components and defining cell construction details and are ground rule clean by construction or verified by simulation or hardware.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1A:
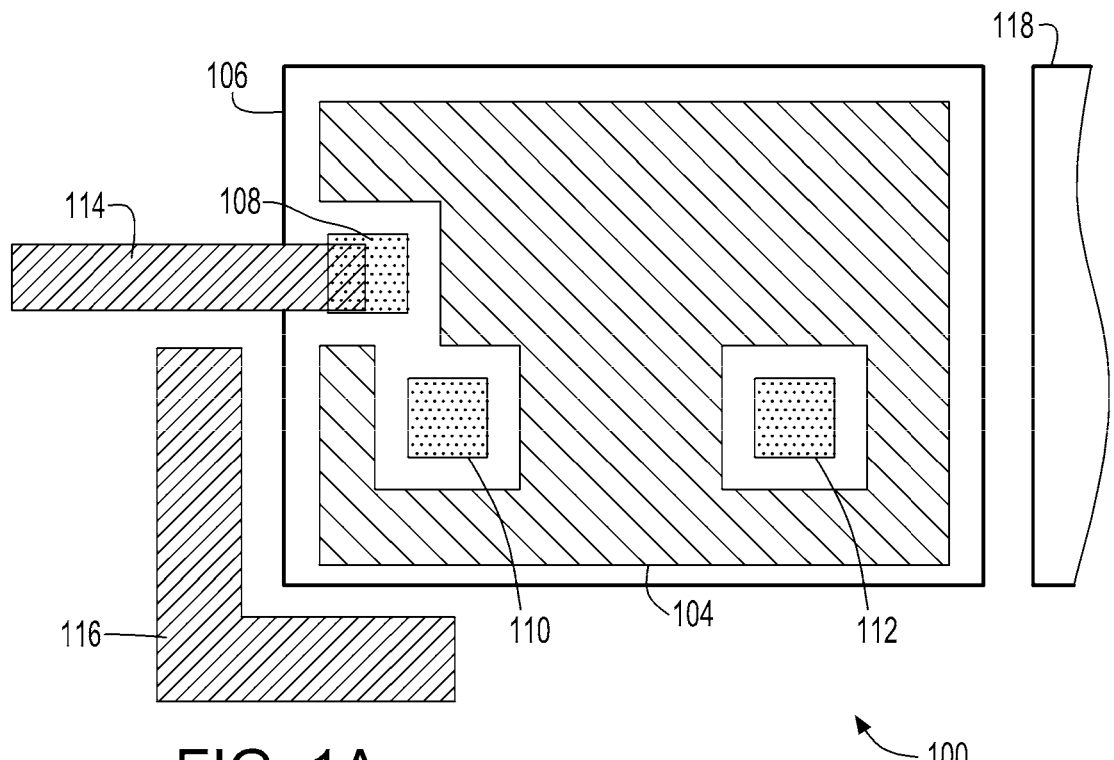
FIGS. 1A-B show an example of a dual representation of a special case cell in a gridded glyph geometric objects (L3GO) format, according to a preferred embodiment of the present invention.
Figure 1B:
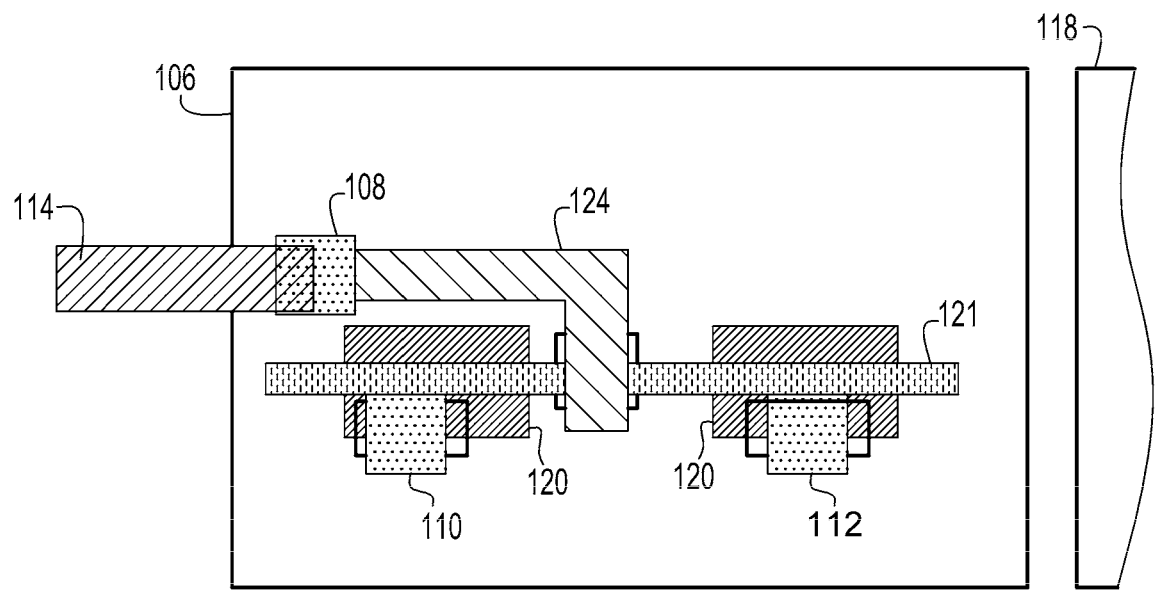

Turning now to the drawings and, more particularly, FIGS. 1A-B show an example of a dual representation 100, 102 of a special case cell, according to a preferred embodiment of the present invention. As used herein, a special case cell includes features that may be process dependent and that require special treatment, e.g., features-specific ground rules and checking. Thus special case cells include, for example only, Static Random Access Memory (SRAM) cells and decoupling capacitors, body contacts, diodes, polysilicon resistors, fuses, or bonding pads, e.g., Controlled Collapse Chip Connections (C4s). This list of special case cells is for example only and not intended as a limitation.

Preferably in this example, the special case cell is in an integrated circuit (IC) chip design in a gridded glyph geometric objects (L3GO) format, such as is described in U.S. Pat. No. 7,536,664, "Physical Design System And Method" to Cohn et al., assigned to the assignee of the present invention and incorporated herein by reference. Further, the present invention is described herein with reference to L3GO design format for example only and not intended as a limitation. The present invention has application to reducing resource requirements in any design system or method for any design that includes at least one special case cell.

Preferably, each special case cell is provided with two representations, one (external) 100 for use in design and another representations of target shapes (internal) 102 substituted for the external cell representation by elaboration. The external view cell or external cell representation 100 is a high level representation that is highly abstract used during the design. Designers use the external cell representation 100, preferably exclusively, for placing, checking (e.g., ground rule checking) and routing, extraction, e.g., as described in Cohn et al., and other design activities. The internal view of the cell or internal cell representation 102 includes glyphs and/or target shapes substituted for the external cell representation during hardware extraction and used, e.g., by the technology team in other detailed hardware analysis flow. It should be noted that in this example, glyphs are represented by two dimensional shapes to better visualize cell contents.

The external cell representation 100 includes any necessary parameterizations, substantially similar to parameterized cells known in the art as pcells. Such parameterizations may include, for example only, body contact, diode, and resistor for width, length. A blockage shape or fence 104 dominates the external cell representation 100 and defines tracks and space where designers can locate outside glyphs/shapes. Each external cell representation 100 includes a cell boundary 106 and pins 108, 110, 112 for external connection, e.g., Input/Output (I/O) connections. Also, each pin 108, 110, 112 includes identification attributes with an access layer (for the connection) and a direction, e.g. for an incoming/outgoing connecting wire 114. Keep out rules define minimum distances from passing shapes 116 to the fence 104. Cell-to-cell rules maintain a minimum distance between adjacent cells, e.g., cell boundary 106 to adjacent cell boundary 118. These rules may be coded with the cell as attributes, defined with ground rules or both.

The internal cell representation 102 is previously defined and ground rule clean by construction and by compliance with external cell rules. In this example, the internal cell representation 102 includes glyphs and/or target shapes, e.g., rectangle glyphs 120 that define diffusions and a polysilicon stick glyph 121 that defines gates at the diffusions, e.g., the gates at the diffusions define pass gates. The connecting wire 114 to pin 108 connects to internal cell wiring 124, either directly (with both wires 114, 124 on the same layer) or, through an inter-level via. Pins 110, 112 locate connections or contacts to diffusions. Furthermore, the internal cell 102 may be an optimized during manufacturing within constraints defined by (fixed) external cells 100, transparent to design. Also, subsequent technology changes contents can be made/applied to the internal cell representation 102 without affecting the overall design.

As noted hereinabove, the internal cell representation 102 includes associated models/parameters that are prefabricated as part of the technology and may be substituted for the external cell representation 100 during extraction and other detailed analysis flow. For example, during physical to logical checking, netlists may be extracted from the internal view. Just as the internal view would be substituted for mask definition, in the design space an extraction unit (or other electrical analysis tool) simply substitutes that extracted model/netlist for the associated external view for checking.

Figure 2:
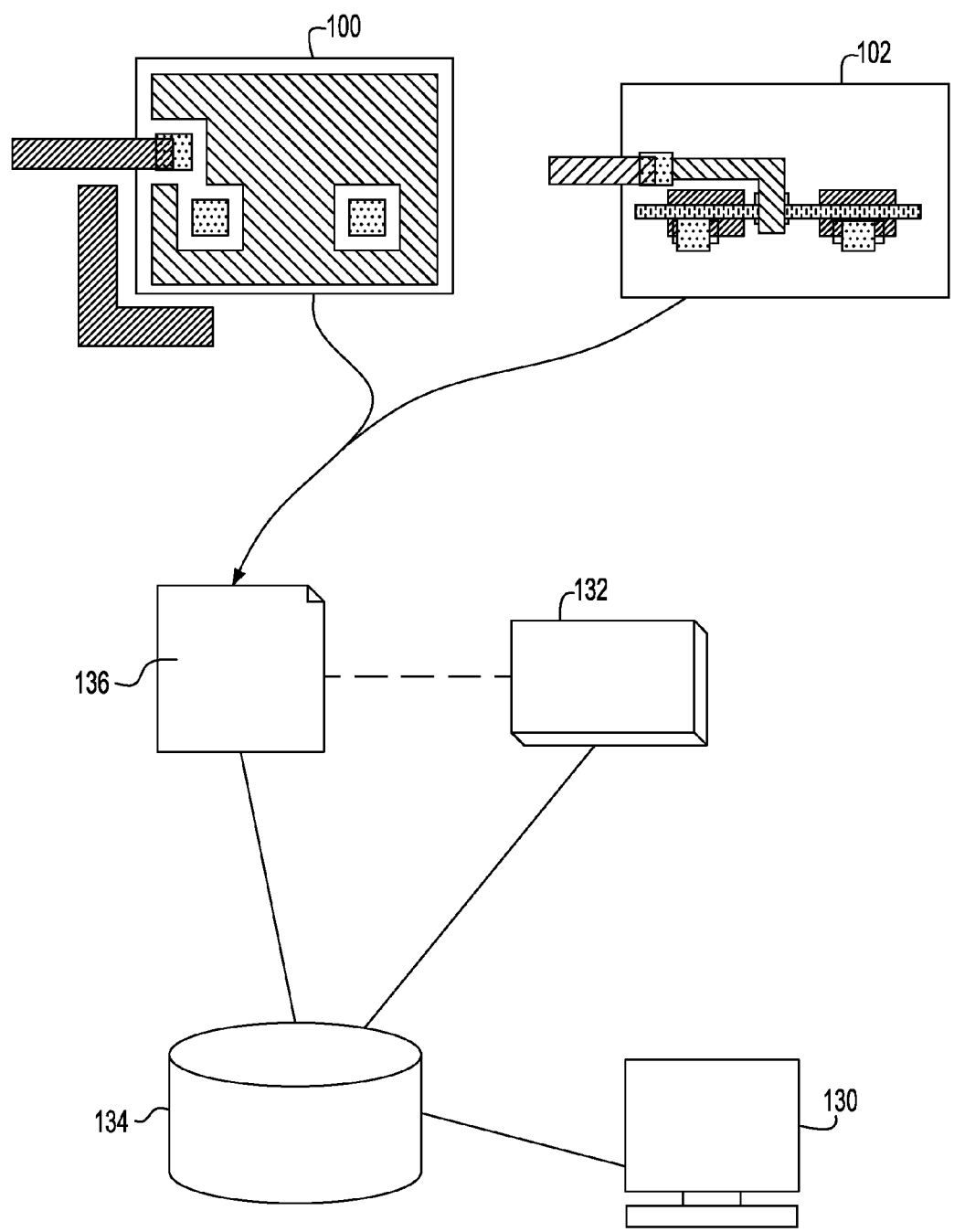
FIG. 2 shows an example of a preferred IC design system for designing ICs that include special case cells.

FIG. 2 shows an example of a preferred IC design system 130, which may be the same as the L3GO system of Cohn et al. or any suitable circuit design system at least with circuit/logic checking and design rule checking capabilities. The system 130 also includes a design library 132 in storage 134. Though not necessarily referred to as such in the system 130, special case cells 136 (in this example including the dual representation 100, 102 of the special case cell of FIGS. 1A-B) may be included in the design library 132 or otherwise in storage 134. When, for example, a design is provided, e.g., as a high level logic definition, external views (e.g., 100) of those special case cells 136 are placed and wired as necessary. Thereafter, the IC design is checked (e.g., checking signal path continuity, logic checking and design rule checking) and elaborated.

Figure 3:
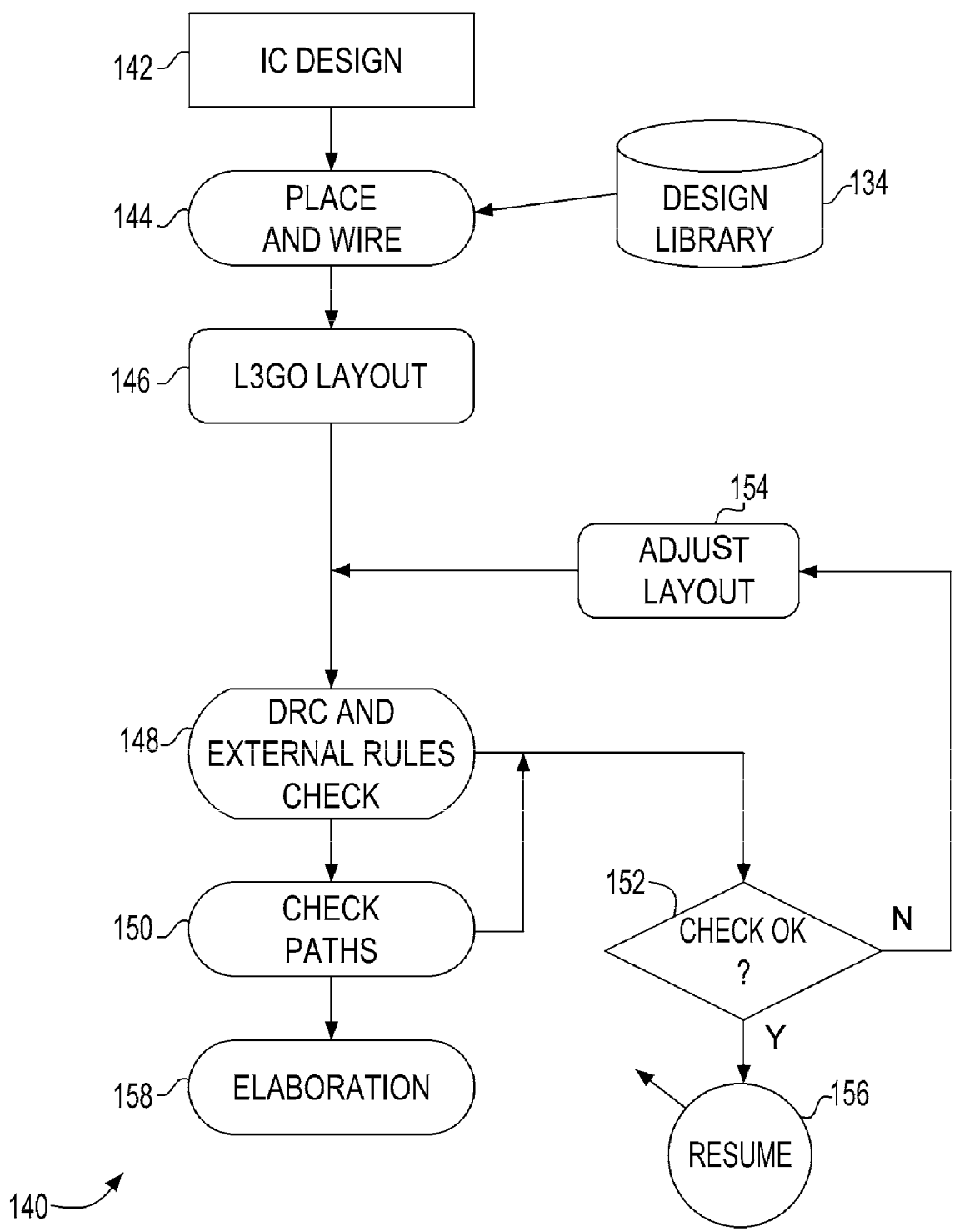
FIG. 3 shows an example of steps in circuit design ICs that include special case cells.

FIG. 3 shows an example of steps in circuit design according to a preferred embodiment of the present invention. A high level design is provided in step 142. In step 144 circuit books, e.g., from the design library in storage 134, and external view cells (e.g., 100) of special case cells 136 are placed and wired. In a L3GO system, the result is a L3GO layout 146. During DRC in step 148 the external representations are rules checked, checking connections to pins and passing wires for keepout rules violations. Next is step 150, the design logic and signal paths are checked normally, based on circuit book contents and internal cell representations, cell placement and wiring. In step 152, if a design error is found, the layout is adjusted/corrected in step 154. If no design errors are found in step 152, then checking continues in step 156 until checking is complete. Finally, in step 158 the design is elaborated, substituting the internal representation of the internal cell for the external representation, and the elaborated design is sent to the mask house, for example for mask making.

Advantageously, preferred dual representation of special case cells (an internal view and an external view of cells representing specialized, process dependent components), are easily integrated into L3GO designs, as well as other standard design entry systems and design flows, for convenient use by circuit designers. The external representation or view is high level abstract representation that includes access pins, boundary and possible blocking shapes/layers and optionally, parameterizations. Each external view includes cell to cell spacing rules and connecting and blocking/keepout rules for routing. Standard pin layer ground rules (e.g., power/ground, input/output), are applied to external cell representations, e.g., 100. The internal representation (e.g., 102) or, internal view includes regular shapes forming cell components and defining cell construction details. Since, the special rules are previously checked for the internal cell representations, the internal cell representations are ground rule clean by construction. Shapes or circuits contained in each internal cell representation need not be checked in a subsequent DRC step, e.g., as described in Cohn et al. So, the number of design rules to write and check for external views is reduced; and, the special feature rules for internal cell representation shapes are not checked when the entire design is checked, reducing the number of rules to check globally. Thus, checking the entire design is much simpler and significantly faster than conventional system, e.g., for ground rule checking.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method for designing a circuit by representing elements of a design for the circuit in an electronic form, said method comprising:
    providing an electronic representation of a cell to a design system, said electronic representation being a dual representation cell including an external representation comprising connection pin locations and a cell boundary, wherein said pin locations are within or juxtaposed against said cell boundary, said dual representation cell further including an internal representation corresponding to a device component; and
    connecting an electronic representation of at least one other design element to said external representation to create a circuit design representation.

2. The method of claim 1 wherein said electronic representation of the cell further comprises at least one rule prohibiting location of other design elements within a certain distance of a portion of the cell boundary or prohibiting the location of other cells within a certain distance.

3. The method of claim 1, further comprising electronically checking said circuit design representation against a set of electronically represented design rules to determine whether said circuit design representation is in compliance with said design rules.

4. The method of claim 3 wherein none of said design rules is associated only with said cell except for (A) a rule prohibiting location of other design elements within a certain distance of a portion of the cell boundary, and (B) a rule prohibiting the location of other cells within a certain distance.

5. The method of claim 1 wherein said internal representation further comprises a description of electronic functionality of one or more cell components.

6. The method of claim 1 further comprising:
    providing an elaboration unit for electronically converting said dual representation cell into a pattern of shapes;
    providing an electronically represented collection of shapes to said elaboration unit, said collection corresponding to one or more components contained in said cell; and
    elaborating each internal representation of cells in said circuit design into an electronically represented pattern of shapes, said elaborating elaboration comprising assigning shapes for said each internal representation.

7. A method of integrated circuit (IC) design comprising:
    inputting to a design system a circuit design including a plurality of circuit design cells connected together into said circuit design, at least one circuit design cell in said circuit design being identified as a special case cell, each said special case cell including an external representation and an internal representation, each said internal representation being in compliance with design rules;
    checking each said external representation of said each special case cell for compliance with external cell representation rules;
    modifying said circuit design for any identified violations for external cell representation rules; and
    analyzing said circuit design for compliance with stated design goals, each said external representation of said each special case cell being used for design goal analysis.

8. The method of IC design as in claim 7, wherein each said special case cell includes at least one feature that is not otherwise included in said circuit design, each said at least one feature requiring unique ground rules, said unique ground rules not being applicable to other circuit features.

9. The method of IC design as in claim 7, wherein ones of said plurality of circuit design cells being connected to said at least one circuit design cell, and wherein said each special case cell includes at least one feature not in any of said plurality of circuit design cells.

10. The method of IC design as in claim 7, wherein said each special case cell includes a cell boundary and at least one pin, said each special case cell connecting to said circuit design at each said at least one pin.

11. The method of IC design as in claim 10, wherein said each external representation of one special case cell further includes a fence defining blockage in a respective said one special case cell boundary.

12. The method of IC design as in claim 11, wherein checking said each external representation comprises design rule checking (DRC) said circuit design, each said internal representation being ignored during said DRC.

13. The method of IC design as in claim 12, wherein checking said each external representation further comprises checking connection rules to said pins and keepout rules to wires adjacent to each said fence.

14. The method of IC design as in claim 13, wherein each said special case cell includes cell attributes and each of said pins includes attributes for access layers and connecting wire direction.

15. The method of IC design as in claim 14, wherein the circuit design is a gridded glyph geometric objects (L3GO) integrated circuit (IC) design and during elaboration each external representation is replaced with a respective internal representation.

16. The method of IC design as in claim 7, wherein inputting the circuit design comprises routing circuit wiring based on placed external representations.

17. The method of IC design as in claim 7, wherein at least one special case cell is a plurality of special case cells including Static Random Access Memory (SRAM) cells, decoupling capacitors, body contacts, diodes, polysilicon resistors, fuses and bonding pads.

18. A design system for integrated circuit (IC) design, said design system comprising:
   storage media;
   a design library in said storage media, said design library including a plurality of circuit books, each of said circuit books including a design for an IC building block; and
   at least one special case cell in said design library, each said special case cell including an external representation and an internal representation, wherein each said external representation is checkable for compliance with external cell representation rules with other circuit books and for IC design compliance with stated design goals, each said internal representation being in compliance with design rules.

19. The design system as in claim 18, wherein each said special case cell is a circuit book that includes at least one feature that is not found in remaining said circuit books, each said at least one feature complying with unique ground rules, said unique ground rules being inapplicable to other circuit features.

20. The design system as in claim 18, wherein each said special case cell includes a cell boundary and at least one pin, ones of other said circuit books connecting to each said special case cell at each said at least one pin.

21. The design system as in claim 20, wherein each said external representation includes a fence defining blockage in a respective said cell boundary.

22. The design system as in claim 21, wherein during design rule checking (DRC) of said IC design, only DRC compliance with said each external representation is checked.

23. The design system as in claim 21 for said each external representation further comprising connection rules to said pins and wire keepout rules to each said fence for adjacent wires.

24. The design system as in claim 23, wherein said each special case cell includes cell attributes and each of said pins includes attributes for access layers and connecting wire direction.

25. The design system as in claim 24, wherein said plurality of circuit books are in gridded glyph geometric objects (L3GO) format and include at least one logic circuit and during elaboration each external representation is replaced with a respective internal representation.

26. The design system as in claim 18, wherein said at least one special case cell is a plurality of special case cells including Static Random Access Memory (SRAM) cells, decoupling capacitors, body contacts, diodes, polysilicon resistors, fuses and bonding pads.

27. A computer program product comprising a computer usable medium having computer readable program code stored thereon for use in causing a computer for integrated circuit (IC) design, said computer readable program code comprising:
   design library computer readable program code means for providing a plurality of standard circuit books, wherein each of said standard circuit books including a design for an IC building block; and
   computer readable program code means for providing one or more special case cells, wherein for each special case cell comprising:
      computer readable program code means for providing an external representation checkable for compliance with external cell representation rules with other special case cells and said standard circuit books, and
      computer readable program code means for providing an internal representation in compliance with stated design goals.

28. The computer program product as in claim 27, wherein said each special case cell includes features complying with unique ground rules, said unique ground rules not being applicable to features in said standard circuit books.

29. The computer program product as in claim 27, wherein said each special case cell includes a cell boundary and at least one pin, connection to said each special case cell from ones of said standard circuit books and other special case cells each being to one said at least one pin.

30. The computer program product as in claim 29, wherein each said external representation defines a fence defining blockage in a respective said cell boundary.

31. The computer program product as in claim 30, wherein during design rule checking (DRC) said IC design, only said DRC compliance with said each external representation is checked.

32. The computer program product as in claim 30, wherein said each external representation includes connection rules to said pins and keepout rules to wires adjacent to each said fence.

33. The computer program product as in claim 32, wherein said special case cells include attributes for said each special case cell and for access layers and a connecting wire direction for each of said pins.

34. The computer program product as in claim 33, wherein said plurality of standard circuit books and each said internal representation are in gridded glyph geometric objects (L3GO) format and during elaboration each said external representation of one special case cell is replaced with a respective internal representation of said one special case cell.

35. The computer program product as in claim 27, wherein said special case cells comprise computer readable program code means for providing Static Random Access Memory (SRAM) cells, decoupling capacitors, body contacts, diodes, polysilicon resistors, fuses and bonding pads.

* * * * *